(12) United States Patent
Sakai

(10) Patent No.: US 8,651,626 B2
(45) Date of Patent: Feb. 18, 2014

(54) PIEZOELECTRIC DEVICE LIQUID EJECTING HEAD, LIQUID EJECTING APPARATUS, ULTRASONIC DEVICE SENSOR, AND TIMING DEVICE

(75) Inventor: Tomohiro Sakai, Chino (JP)

(73) Assignee: Seiko Epson Corporation, Tokyo (JP)

(*) Notice: Subject to any disclaimer, the term of this patent is extended or adjusted under 35 U.S.C. 154(b) by 85 days.

(21) Appl. No.: 13/080,010

(22) Filed: Apr. 5, 2011

(65) Prior Publication Data

US 2011/0254899 A1  Oct. 20, 2011

(30) Foreign Application Priority Data

Apr. 14, 2010 (JP) ................................. 2010-092906

(51) Int. Cl.
*B41J 2/045* (2006.01)

(52) U.S. Cl.
USPC ............................................................ 347/68

(58) Field of Classification Search
USPC ............................................................ 347/71
See application file for complete search history.

(56) References Cited

U.S. PATENT DOCUMENTS

| 8,231,803 B2* | 7/2012 | Furukawa et al. ..... 252/62.9 PZ |
| 2006/0012648 A1* | 1/2006 | Ifuku et al. ................ 347/72 |
| 2008/0211881 A1* | 9/2008 | Ifuku et al. ................ 347/70 |

FOREIGN PATENT DOCUMENTS

| CN | 1541977 A * | 11/2004 |
| JP | 2005-105295 | 4/2005 |

* cited by examiner

*Primary Examiner* — Lisa M Solomon
(74) *Attorney, Agent, or Firm* — Workman Nydegger

(57) ABSTRACT

A liquid ejecting head comprises a pressure chamber communicating with nozzle and a piezoelectric actuator including a piezoelectric layer and an electrode which applies a voltage to the piezoelectric layer. The piezoelectric layer is composed of a solid solution containing bismuth sodium titanate and 0.2 mol % or more and 8.0 mol % or less of copper.

12 Claims, 7 Drawing Sheets

PIEZOELECTRIC DEVICE LIQUID EJECTING HEAD, LIQUID EJECTING APPARATUS, ULTRASONIC DEVICE SENSOR, AND TIMING DEVICE

CROSS-REFERENCE TO RELATED APPLICATIONS

This application claims the benefit of priority to Japanese Patent Application No. 2010-092906 filed Apr. 14, 2010, the contents of which are hereby incorporated by reference in their entirety.

BACKGROUND

1. Technical Field

The present invention relates to a liquid ejecting head, a liquid ejecting apparatus, and a piezoelectric element.

2. Related Art

A liquid ejecting head is used as a component of a liquid ejecting apparatus such as an ink jet printer. In an ink jet printer, a liquid ejecting head is configured to eject and fly droplets of ink such that the ink is made to adhere to media such as paper sheets. In this way, printing is performed with the ink jet printer.

In general, such a liquid ejecting head includes an actuator that applies pressure to liquid to thereby eject the liquid from nozzles of the liquid ejecting head. Such an actuator includes, for example, a piezoelectric element. For example, such a piezoelectric element in an actuator has a structure in which a piezoelectric layer composed of a piezoelectric material having an electromechanical transduction function such as a crystallized piezoelectric ceramic is sandwiched between two electrodes. Such a piezoelectric element is configured to deform under the application of a voltage by the two electrodes. Due to the deformation of the piezoelectric element, the actuator can be operated in, for example, a flexural vibration mode.

Piezoelectric materials used for such an application desirably have a good piezoelectricity such as electromechanical transduction efficiency. Accordingly, lead zirconate titanate (PZT) materials, which are excellent in terms of the piezoelectricity compared with other materials, have been studied and developed. However, while there has been an ever increasing demand for piezoelectric materials with enhanced piezoelectricity and there has also been a demand for piezoelectric materials having a lower environmental load in recent years, it is difficult to meet these demands with PZT materials. Thus, for example, perovskite-oxide piezoelectric materials, which have less lead content, have been developed.

The piezoelectricity of piezoelectric elements can be evaluated with the shape of a hysteresis loop obtained by subjecting the piezoelectric elements to a P-E measurement. Bismuth sodium titanate, which can be represented by, for example, $(Bi_{0.5}, Na_{0.5})TiO_3$ (hereafter, sometimes abbreviated as "BNT"), has been regarded as a promising piezoelectric material. However, although BNT in the form of a bulk exhibits a general hysteresis loop, in spite of the same BNT composition, BNT in the form of a thin film has a high leakage current and does not exhibit a good hysteresis loop (For example, refer to JP-A-2005-105295).

SUMMARY

An advantage of some aspects of the invention is to provide a liquid ejecting head including a piezoelectric layer having a low environmental load and a good piezoelectricity; and a liquid ejecting apparatus including such a liquid ejecting head. Another advantage of some aspects of the invention is to provide a piezoelectric element including a piezoelectric layer having a low environmental load and a good piezoelectricity.

The invention has been accomplished to achieve at least a part of the advantages and can be embodied as the following aspects or embodiments.

First Embodiment

A liquid ejecting head according to a first aspect of the invention includes a piezoelectric actuator including a piezoelectric layer formed by a thin-film method and an electrode that applies a voltage to the piezoelectric layer, wherein the piezoelectric layer is composed of a solid solution containing bismuth sodium titanate and 0.2 mol % or more and 8.0 mol % or less of copper.

According to the liquid ejecting head of the first embodiment, although the liquid ejecting head includes a piezoelectric layer containing bismuth sodium titanate having a low environmental load, the piezoelectric layer can have a low leakage current and a good piezoelectricity.

Second Embodiment

In the first embodiment, the piezoelectric layer may contain 0.2 mol % or more and 4.0 mol % or less of copper.

According to the liquid ejecting head of the second embodiment, the piezoelectric layer can have a lower leakage current and a better piezoelectricity.

Third Embodiment

In the first or second embodiment, the piezoelectric layer may further contain barium titanate.

According to the liquid ejecting head of the third embodiment, although the piezoelectric layer further contains barium titanate, the piezoelectric layer can have a low leakage current and a good piezoelectricity.

Fourth Embodiment

In the third embodiment, the piezoelectric layer may contain less than 100 mol % and 85 mol % or more of the bismuth sodium titanate and more than 0 mol % and 15 mol % or less of the barium titanate.

According to the liquid ejecting head of the fourth embodiment, although the piezoelectric layer contains the predetermined proportions of bismuth sodium titanate and barium titanate, the piezoelectric layer can have a low leakage current and a good piezoelectricity.

Fifth Embodiment

In any one of the first to third embodiments, the piezoelectric layer may further contain bismuth potassium titanate.

According to the liquid ejecting head of the fifth embodiment, although the piezoelectric layer further contains bismuth potassium titanate, the piezoelectric layer can have a low leakage current and a good piezoelectricity.

Sixth Embodiment

In the fifth embodiment, the piezoelectric layer may contain less than 100 mol % and 67 mol % or more of the bismuth sodium titanate, more than 0 mol % and 30 mol % or less of the bismuth potassium titanate, and more than 0 mol % and 3 mol % or less of the barium titanate.

According to the liquid ejecting head of the sixth embodiment, although the piezoelectric layer contains the predetermined proportions of bismuth sodium titanate, bismuth potassium titanate, and barium titanate, the piezoelectric layer can have a low leakage current and a good piezoelectricity.

Seventh Embodiment

A liquid ejecting apparatus according to a second aspect of the invention includes the liquid ejecting head according to any one of the first to sixth embodiments.

Although the liquid ejecting apparatus of the seventh embodiment includes a piezoelectric layer containing bismuth sodium titanate having a low environmental load, the piezoelectric layer can have a low leakage current and a good piezoelectricity.

Eighth Embodiment

A piezoelectric element according to a third aspect of the invention includes a piezoelectric layer formed by a thin-film method; and an electrode that applies a voltage to the piezoelectric layer, wherein the piezoelectric layer is composed of a solid solution containing bismuth sodium titanate and 0.2 mol % or more and 8.0 mol % or less of copper.

Although the piezoelectric element in the eighth embodiment includes a piezoelectric layer containing bismuth sodium titanate having a low environmental load, the piezoelectric layer can have a low leakage current and a good piezoelectricity.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described with reference to the drawings. Note that these embodiments described below are mere examples of the invention. Accordingly, the invention is not restricted to these embodiments and encompasses various modifications made without departing from the spirit and scope of the invention. Note that the invention does not necessarily require all the features described in the embodiments below.

1. Piezoelectric Element and Piezoelectric Actuator

Figure 1:
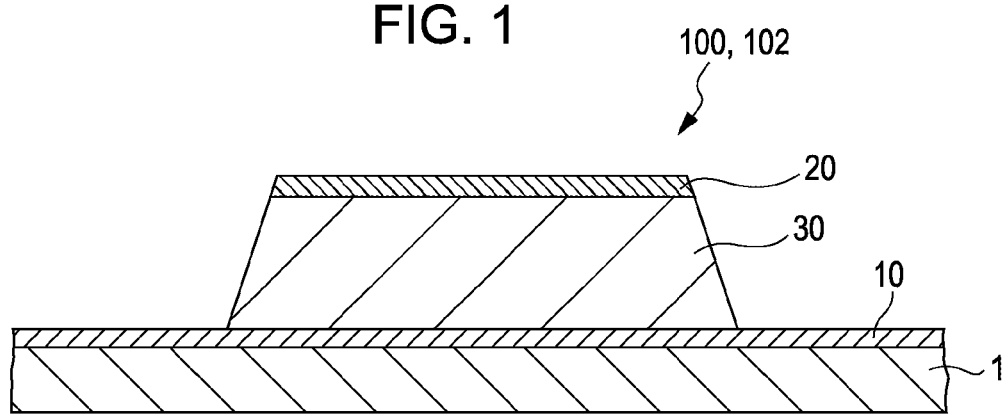
FIG. 1 is a schematic sectional view of a piezoelectric element 100 (piezoelectric actuator 102) according to an embodiment.

FIG. 1 is a schematic sectional view of a piezoelectric element 100 according to an embodiment of the invention.

The piezoelectric element 100 according to the embodiment includes a first conductive layer 10, a second conductive layer 20, and a piezoelectric layer 30.

1.1. First Conductive Layer

The first conductive layer 10 is formed on, for example, a substrate 1. The substrate 1 may be, for example, a flat plate composed of an electrical conductor, a semiconductor, or an electrical insulator. The substrate 1 may have a structure constituted by a single layer or a stack of a plurality of layers. As long as the substrate 1 has a top surface that is flat, the internal structure thereof is not restricted. For example, the substrate 1 may have internal spaces. In the case where pressure chambers and the like are formed under the substrate 1 as in a liquid ejecting head described below, the substrate 1 and such a plurality of components formed under the substrate 1 may be collectively regarded as the substrate 1.

The substrate 1 may have flexibility and serve as a vibration plate that can be deformed (bent) by the action of the piezoelectric layer 30. In this case, the piezoelectric element 100 functions as a piezoelectric actuator 102 including the vibration plate, the first conductive layer 10, the piezoelectric layer 30, and the second conductive layer 20. Herein, when the substrate 1 has flexibility as described above, the substrate 1 can be bent. When the substrate 1 serves as a vibration plate and the piezoelectric actuator 102 is used as a liquid ejecting head, the degree to which the substrate 1 is bent will suffice that the volume of the pressure chambers can be changed by substantially the same value as the volume of liquid to be ejected.

When the substrate 1 serves as a vibration plate, examples of a material for forming the substrate 1 include inorganic oxides such as zirconium oxide ($ZrO_2$), silicon nitride, and silicon oxide; and alloys such as stainless steel. Of these, zirconium oxide is particularly preferred as the material of the substrate 1 serving as a vibration plate in terms of chemical stability and stiffness. The substrate 1 may have a structure in which layers composed of two or more of the listed materials are stacked.

In the embodiment, the case where the substrate 1 serves as a vibration plate and is composed of zirconium oxide will be described as an example. Accordingly, the piezoelectric element 100 is substantially the same as the piezoelectric actuator 102 including a vibration plate that has flexibility and can be deformed (bent) by the action of the piezoelectric layer 30. In the following description, the piezoelectric element 100 and the piezoelectric actuator 102 are interchangeable.

The shape of the first conductive layer 10 is not restricted as long as the first conductive layer 10 can face the second conductive layer 20. However, since the piezoelectric layer 30 is formed so as to have the shape of a thin film in the embodiment, the first conductive layer 10 is preferably formed so as to have the shape of a layer or a thin film. The first conductive layer 10 may have a thickness of, for example, 50 nm or more and 300 nm or less. The planar shape of the first conductive layer 10 is also not restricted as long as the piezoelectric layer 30 can be disposed between the first conductive layer 10 and the second conductive layer 20 that face each other. The planar shape of the first conductive layer 10 may be, for example, a rectangle, a circle, or the like.

A function of the first conductive layer 10 is to serve as an electrode (for example, a lower electrode formed under the piezoelectric layer 30) that applies a voltage to the piezoelectric layer 30, together with the second conductive layer 20 serving as another electrode. The first conductive layer 10 may have a function of controlling crystal orientation during crystallization of the piezoelectric layer 30.

Examples of a material for forming the first conductive layer 10 include various metals such as nickel, iridium, and platinum; conductive oxides of such metals (for example, iridium oxide); strontium-ruthenium composite oxides ($SrRuO_x$: SRO); and lanthanum-nickel composite oxides ($LaNiO_x$: LNO). The first conductive layer 10 may have a structure constituted by a single layer composed of such a material or a plurality of layers that are composed of two or more of the listed materials and are stacked.

1.2. Second Conductive Layer

The second conductive layer 20 is disposed so as to face the first conductive layer 10. Specifically, the entirety of the second conductive layer 20 may face the first conductive layer 10; alternatively, a portion of the second conductive layer 20 may face the first conductive layer 10. The shape of the second conductive layer 20 is not restricted as long as the second conductive layer 20 can face the first conductive layer 10. However, since the piezoelectric layer 30 is formed so as to have the shape of a thin film in the embodiment, the second conductive layer 20 is preferably formed so as to have the shape of a layer or a thin film. The second conductive layer 20 may have a thickness of, for example, 50 nm or more and 300 nm or less. The planar shape of the second conductive layer 20 is also not restricted as long as the piezoelectric layer 30 can be disposed between the second conductive layer 20 and the first conductive layer 10 that face each other. The planar shape of the second conductive layer 20 may be, for example, a rectangle, a circle, or the like.

A function of the second conductive layer 20 is to serve as an electrode (for example, an upper electrode formed on the piezoelectric layer 30) that applies a voltage to the piezoelectric layer 30, together with the first conductive layer 10 serving as another electrode. The second conductive layer 20 may have a function of controlling crystal orientation during crystallization of the piezoelectric layer 30. The second conductive layer 20 may be formed of a material/materials as in the first conductive layer 10.

FIG. 1 illustrates an example in which the first conductive layer 10 is formed so as to have a larger planar area than the second conductive layer 20. Alternatively, the second conductive layer 20 may be formed so as to have a larger planar area than the first conductive layer 10. In this case, the second conductive layer 20 may be formed so as to cover the side surfaces of the piezoelectric layer 30 and the second conductive layer 20 can also function as a protective layer that protects the piezoelectric layer 30 from moisture, hydrogen, or the like.

1.3. Piezoelectric Layer

The piezoelectric layer 30 is disposed between the first conductive layer 10 and the second conductive layer 20. The piezoelectric layer 30 may be in contact with at least one of the first conductive layer 10 and the second conductive layer 20. In the example illustrated in FIG. 1, the piezoelectric layer 30 is disposed so as to be in contact with the first conductive layer 10 and the second conductive layer 20.

The piezoelectric layer 30 is formed by a thin-film method. Herein, the term "thin-film method" refers to at least one method among a sputtering method, a deposition method, a metal-organic chemical vapor deposition (MOCVD) method, a metal-organic decomposition (MOD) method, a pulsed laser deposition (PLD) (laser ablation) method, a mist film-formation method, and a sol-gel method. Accordingly, the piezoelectric layer 30 in the embodiment is not formed in the form of a bulk. That is, the piezoelectric layer 30 is not formed by, for example, forming a bulk and then reducing the thickness of the bulk by polishing or the like to turn the bulk into a thin film.

The thickness of the piezoelectric layer 30 is not restricted as long as the piezoelectric layer 30 is formed by a thin-film method and may be, for example, 100 nm or more and 3,000 nm or less. Consider the cases where the piezoelectric layer 30 having a large thickness is formed by a thin-film method. For example, when a method of depositing a material such as a sputtering method, a deposition method, or an MOCVD method is employed, the piezoelectric layer 30 having a large thickness can be formed by increasing the time over which the deposition is performed. Alternatively, for example, when a method in which coating and firing are performed such as an MOD method or a sol-gel method is employed, the piezoelectric layer 30 having a large thickness can be formed by repeating such a method to stack the resultant layers. In such a case where layers are stacked, different thin-film methods may be employed for forming the layers. When the piezoelectric layer 30 has a thickness that is not within the above-described range, there may be cases where the withstand voltage of the piezoelectric layer 30 is insufficient or sufficient deformation (electromechanical transduction) of the piezoelectric layer 30 is not achieved.

The piezoelectric layer 30 in the embodiment is composed of a solid solution containing bismuth sodium titanate and 0.2 mol % or more and 8.0 mol % or less of copper. Bismuth sodium titanate, which can be represented by, for example, $(Bi_{0.5}, Na_{0.5})TiO_3$ (hereafter, sometimes abbreviated as "BNT"), is classified as a perovskite oxide, that is, a composite oxide represented by a general formula $ABO_3$ where bismuth atoms and sodium atoms occupy the A sites and titanium atoms occupy the B sites. BNT can have a perovskite crystalline structure as a result of crystallization and can exhibit piezoelectricity in the form of a bulk. However, while a bulk composed of BNT only can exhibit a good hysteresis loop, a thin film composed of BNT only has high leakage current and cannot exhibit a good hysteresis loop. The inventors of the invention consider that this is probably caused by the following reason. As for the BNT bulk, a piezoelectric layer is fired at 1,000° C. or more and then an electrode is formed at a low temperature. In contrast, as for the BNT thin film, a piezoelectric layer is formed at a high temperature on a previously formed electrode and hence a good interface is not formed between the piezoelectric layer and the electrode. The piezoelectric layer 30 in the embodiment is formed so as to contain bismuth sodium titanate and a predetermined amount of copper and hence even when the piezoelectric layer 30 is formed by a thin-film method, the piezoelectric layer 30 has a low leakage current and can exhibit a good hysteresis loop. Thus, in the embodiment, a good interface is probably formed between the piezoelectric layer 30 and the first conductive layer 10. Accordingly, the piezoelectric layer 30 can be deformed by the application of an electric field with the first conductive layer 10 and the second conductive layer 20. As a result of the deformation, for example, the substrate 1 can be bent or vibrated. Thus, the piezoelectric actuator 102 can be provided.

The piezoelectric layer 30 can be made to contain bismuth sodium titanate and 0.2 mol % or more and 4.0 mol % or less of copper. In this piezoelectric layer 30, leakage current can be reduced. Furthermore, the piezoelectric layer 30 can be made to contain bismuth sodium titanate and 0.5 mol % or more and 4.0 mol % or less of copper. In this piezoelectric layer 30, leakage current can be further reduced.

When the piezoelectric layer 30 in the embodiment is composed of a solid solution mainly containing bismuth sodium titanate, for example, the piezoelectric layer 30 may have a mixed crystal configuration containing less than 100 mol % and 50 mol % or more of bismuth sodium titanate and more than 0 mol % and less than 50 mol % of another piezoelectric material(s). Such another piezoelectric material(s) may be a perovskite oxide(s) and may be at least one selected from the lead-free compound group consisting of barium titanate, bismuth potassium titanate, sodium niobate, potassium niobate, lithium niobate, bismuth ferrite, bismuth chromate, bismuth cobaltate, and bismuth aluminate. For example, the piezoelectric layer 30 can be made to contain less than 100 mol % and 85 mol % or more of bismuth sodium titanate and more than 0 mol % and 15 mol % or less of barium titanate. Alternatively, for example, the piezoelectric layer 30 can be made to contain less than 100 mol % and 67 mol % or more of bismuth sodium titanate, more than 0 mol % and 30 mol % or less of bismuth potassium titanate, and more than 0 mol % and 3 mol % or less of barium titanate. Barium titanate can be represented by, for example, $BaTiO_3$ (hereafter, sometimes abbreviated as "BT"). Bismuth potassium titanate can be represented by, for example, $(Bi_{0.5}, K_{0.5})TiO_3$ (hereafter, sometimes abbreviated as "BKT"). When BNT, BT, BKT, or the like has a stoichiometric composition, the composition ratio (hereafter, referred to as A/B) of the molar amount of an element(s) occupying the A sites to the molar amount of an element(s) occupying the B sites in $ABO_3$ is 1. However, BNT, BT, BKT, or the like may have a non-stoichiometric composition. The amount (mol %) of copper added to the piezoelectric layer 30 in the embodiment is based on 100 mol % of bismuth sodium titanate or 100 mol % of a mixed-crystal perovskite oxide(s).

1.4. Advantages and the Like

The piezoelectric element 100 (piezoelectric actuator 102) according to the embodiment includes the piezoelectric layer 30 and hence at least has low leakage current and exhibits a good hysteresis loop. The hysteresis loop of the piezoelectric layer 30 is obtained by subjecting the piezoelectric layer 30 to a P-E measurement and can be used as a criterion with which the piezoelectricity of the piezoelectric layer 30 is evaluated. Specifically, the piezoelectric layer 30 exhibiting a good hysteresis loop can be evaluated as having a good piezoelectricity. The piezoelectric layer 30 according to the embodiment is composed of a lead-free compound(s) and hence can have a low environmental load and can also have a good piezoelectricity.

The piezoelectric element 100 according to the embodiment can be used for a wide range of applications. The piezoelectric actuator 102 is applicable to, for example, a liquid ejecting head, a liquid ejecting apparatus such as an ink jet printer, or the like. The piezoelectric element 100 is suitably applicable to a sensor such as a gyro sensor or an acceleration sensor, a timing device such as a tuning fork vibrator, or an ultrasonic device such as an ultrasonic motor.

2. Production Method of Piezoelectric Element

The piezoelectric element 100 according to the embodiment can be produced in, for example, the following manner.

The substrate 1 is prepared. Then, the first conductive layer 10 is formed on the substrate 1. The first conductive layer 10 may be formed by, for example, a sputtering method, a plating method, a vacuum deposition method, or the like. If necessary, the first conductive layer 10 may be patterned.

Then, the piezoelectric layer 30 is formed on the first conductive layer 10. As described above, the piezoelectric layer 30 can be formed by, for example, at least one method selected from a sputtering method, a deposition method, a metal-organic chemical vapor deposition (MOCVD) method, a metal-organic decomposition (MOD) method, a pulsed laser deposition (PLD) (laser ablation) method, a mist film-formation method, and a sol-gel method; or a plurality of methods in combination selected from these methods. The piezoelectric layer 30 can be crystallized, for example, at a temperature of 550° C. or more and 800° C. or less and in an oxygen atmosphere. The heat-treatment temperature for the crystallization of the piezoelectric layer 30 may be, for example, 550° C. or more and 850° C. or less, or may be 600° C. or more and 750° C. or less. Note that the crystallization may be performed after the piezoelectric layer 30 is patterned. If necessary, such a step may be repeated such that the piezoelectric layer 30 having a desired thickness is provided.

Then, the second conductive layer 20 is formed on the piezoelectric layer 30. The second conductive layer 20 may be formed by, for example, a sputtering method, a plating method, a vacuum deposition method, or the like. Subsequently, the second conductive layer 20 and the piezoelectric layer 30 are patterned so as to have a desired shape. Thus, the piezoelectric element is formed. Note that, if necessary, the second conductive layer 20 and the piezoelectric layer 30 may be simultaneously patterned. The piezoelectric element 100 according to the embodiment can be produced through such steps having been described as an example.

3. Liquid Ejecting Head

Figure 2:
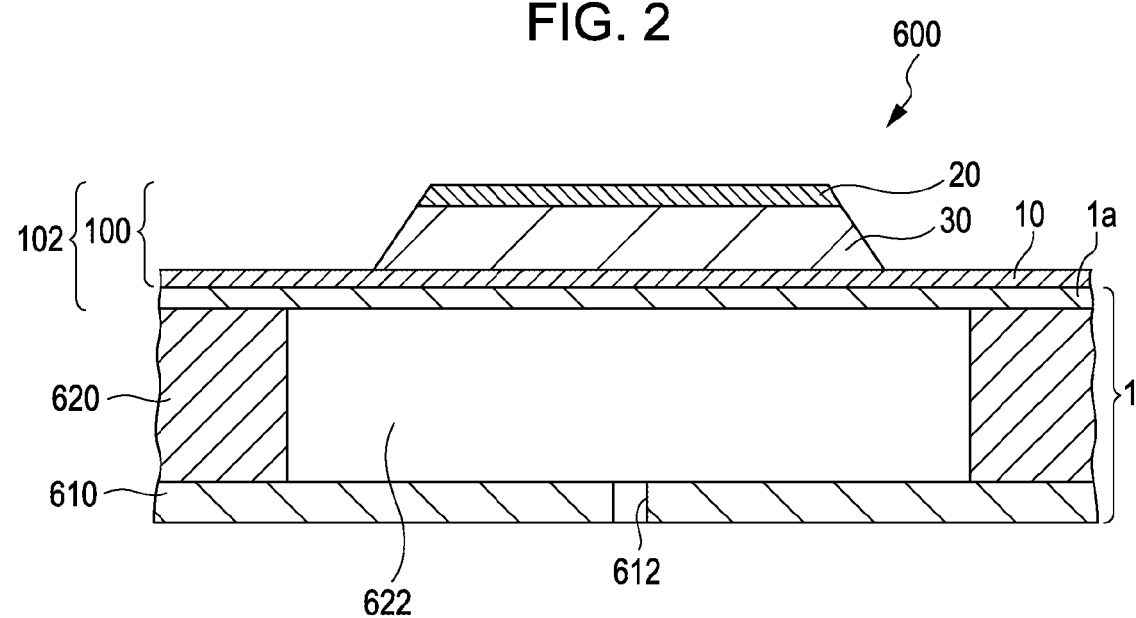
FIG. 2 is a schematic sectional view of a liquid ejecting head 600 according to an embodiment.
Figure 3:
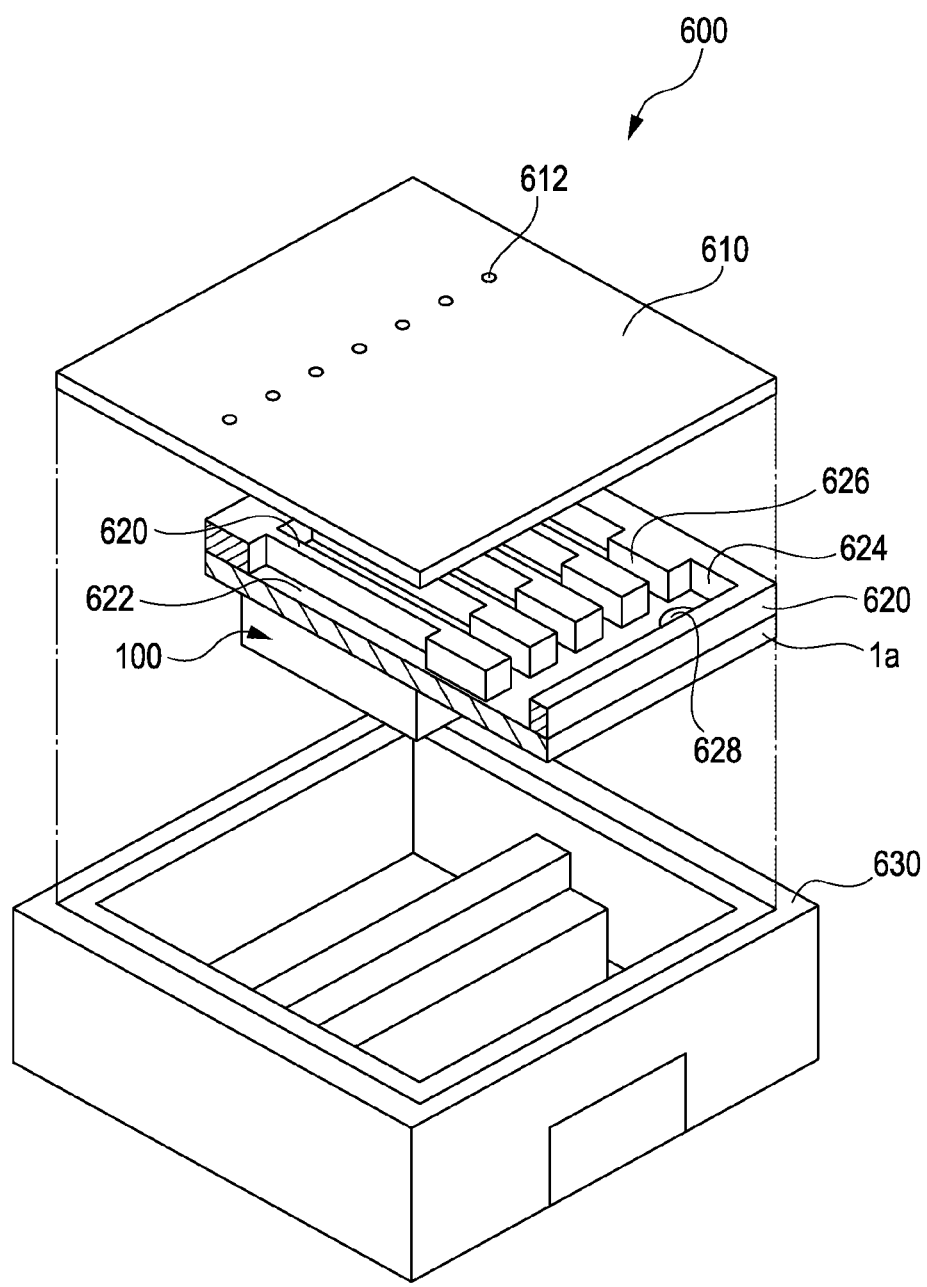
FIG. 3 is an exploded perspective view illustrating a liquid ejecting head 600 according to an embodiment.

Hereinafter, as an example of the application of a piezoelectric element (piezoelectric actuator) according to the embodiment, a liquid ejecting head 600 including such a piezoelectric element (piezoelectric actuator) will be described with reference to drawings. FIG. 2 is a schematic sectional view illustrating a main portion of the liquid ejecting head 600. FIG. 3 is an exploded perspective view of the liquid ejecting head 600 illustrated upside down.

The liquid ejecting head 600 can include the above-described piezoelectric element (piezoelectric actuator). Hereinafter, the liquid ejecting head 600 in which the piezoelectric element 100 is formed on the substrate 1 (structure including a vibration plate 1a in an upper portion thereof) and the piezoelectric element 100 and the vibration plate 1a constitute the piezoelectric actuator 102, will be described as an example.

As illustrated in FIGS. 2 and 3, the liquid ejecting head 600 includes a nozzle plate 610 including nozzle openings 612, a pressure chamber substrate 620 for forming pressure chambers 622, and the piezoelectric element 100. As illustrated in FIG. 3, the liquid ejecting head 600 may further include a casing 630. Note that the piezoelectric element 100 is simply illustrated in FIG. 3.

As illustrated in FIGS. 2 and 3, the nozzle plate 610 includes the nozzle openings 612. Ink can be ejected through the nozzle openings 612. For example, a large number of the nozzle openings 612 are arranged in a line on the nozzle plate 610. The nozzle plate 610 may be formed of a material such as silicon or stainless steel (SUS).

The pressure chamber substrate 620 is disposed on the nozzle plate 610 (in FIG. 3, under the nozzle plate 610). The pressure chamber substrate 620 may be formed of a material such as silicon. As illustrated in FIG. 3, the pressure chamber substrate 620 sections the space between the nozzle plate 610 and the vibration plate 1a into a reservoir (liquid storage section) 624, supply ports 626 in communication with the reservoir 624, and the pressure chambers 622 in communication with the supply ports 626. In the example, the reservoir 624, the supply ports 626, and the pressure chambers 622 are described as different portions. However, all these portions are liquid channels and such channels may be freely designed. For example, in the example illustrated in FIG. 3, the supply ports 626 correspond to narrowed portions of the liquid channels. However, the supply ports 626 may be freely formed depending on a design and are not necessarily indispensable portions. The reservoir 624, the supply ports 626, and the pressure chambers 622 are delimited by the nozzle plate 610, the pressure chamber substrate 620, and the vibration plate 1a. The reservoir 624 is configured to temporarily store ink therein, the ink being fed from the outside (for example, an ink cartridge) through a through hole 628 provided in the vibration plate 1a. The ink in the reservoir 624 can be fed through the supply ports 626 to the pressure chambers 622. The volume of the pressure chambers 622 is changed by deformation of the vibration plate 1a. The pressure chambers 622 are in communication with the nozzle openings 612. As a result of a change in the volume of the pressure chambers 622, ink or the like is ejected through the nozzle openings 612.

The piezoelectric element 100 is disposed on the pressure chamber substrate 620 (in FIG. 3, under the pressure chamber substrate 620). The piezoelectric element 100 is electrically connected to a piezoelectric element driving circuit (not shown) and can be made to operate (vibrate or deform) on the basis of signals fed from the piezoelectric element driving circuit. The vibration plate 1a can be deformed by the action of the piezoelectric layer 30 to thereby appropriately change the internal pressure of the pressure chambers 622.

As illustrated in FIG. 3, the casing 630 can contain the nozzle plate 610, the pressure chamber substrate 620, and the piezoelectric element 100. The casing 630 may be formed of a material such as a resin or a metal.

The liquid ejecting head 600 includes the above-described piezoelectric element 100, which at least has a high withstand voltage. Accordingly, the liquid ejecting head 600 has a high withstand voltage, can be operated under a high voltage, and has a high capability of ejecting liquid or the like, compared with existing liquid ejecting heads.

Note that the case where the liquid ejecting head 600 is an ink jet recording head was described above. However, a liquid ejecting head according to the embodiment can also be used as, for example, a colorant ejecting head used for producing color filters of liquid crystal displays or the like; an electrode material ejecting head used for forming electrodes of organic EL displays, field emission displays (FEDs), or the like; or a bioorganic material ejecting head used for producing biochips.

4. Liquid Ejecting Apparatus

Figure 4:
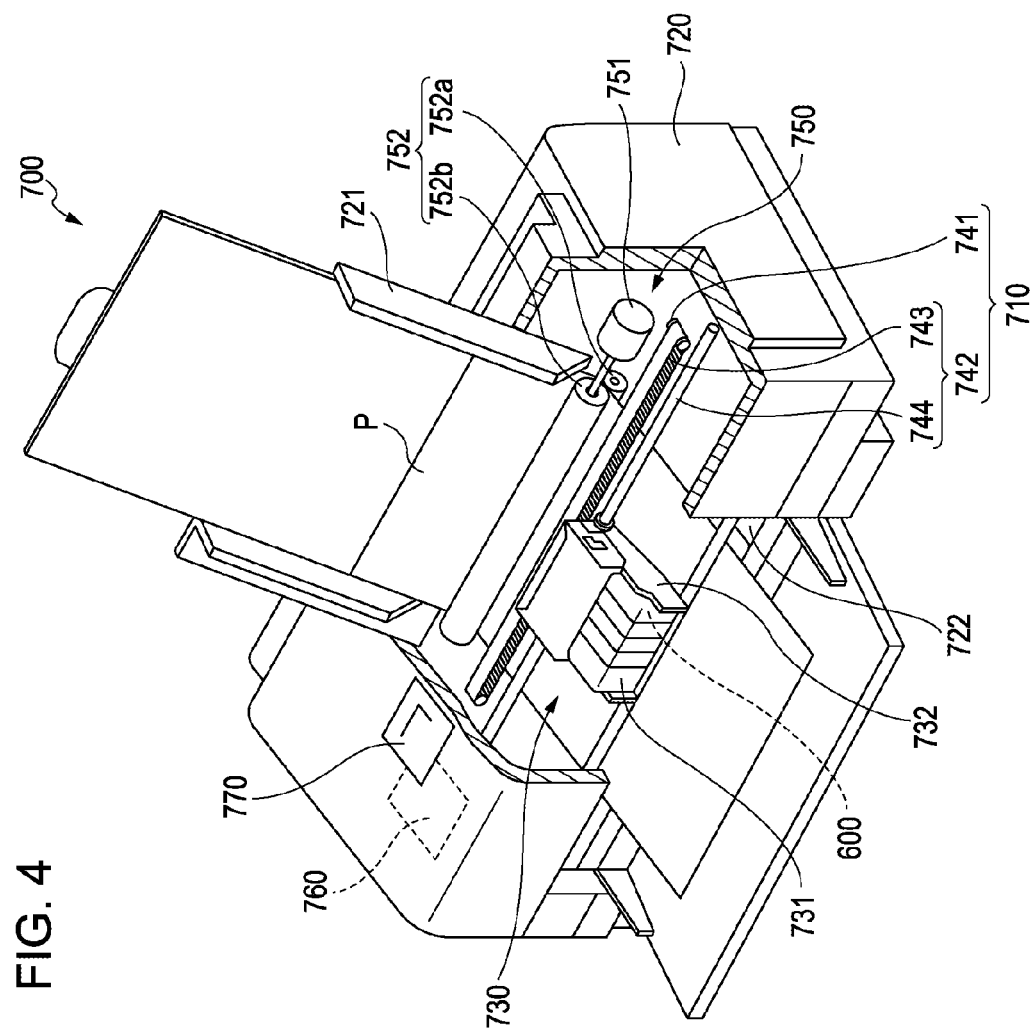
FIG. 4 is a schematic perspective view illustrating a liquid ejecting apparatus 700 according to an embodiment.

Hereinafter, a liquid ejecting apparatus according to an embodiment of the invention will be described with reference to a drawing. The liquid ejecting apparatus includes the above-described liquid ejecting head. In the following description, a case where the liquid ejecting apparatus is an ink jet printer including the above-described liquid ejecting head will be described. FIG. 4 is a schematic perspective view illustrating a liquid ejecting apparatus 700 according to the embodiment.

As illustrated in FIG. 4, the liquid ejecting apparatus 700 includes a head unit 730, a driving section 710, and a control section 760. The liquid ejecting apparatus 700 may further include an apparatus body 720, a paper sheet supply section 750, a tray 721 on which recording paper sheets P are placed, an ejection opening 722 for ejecting recording paper sheets P, and an operation panel 770 disposed on the top surface of the apparatus body 720.

The head unit 730 includes an ink jet recording head (hereafter, may be simply referred to as "head") constituted by the above-described liquid ejecting head 600. The head unit 730 further includes an ink cartridge 731 for supplying ink to the head and a carrying section (carriage) 732 on which the head and the ink cartridge 731 are mounted.

The driving section 710 can reciprocate the head unit 730. The driving section 710 includes a carriage motor 741 serving as a driving source of the head unit 730, and a reciprocating mechanism 742 configured to reciprocate the head unit 730 by the rotation of the carriage motor 741.

The reciprocating mechanism 742 includes a carriage guide shaft 744 both ends of which are supported by a frame (not shown), and a timing belt 743 extending in parallel with the carriage guide shaft 744. The carriage guide shaft 744 supports the carriage 732 such that the carriage 732 can be freely reciprocated. The carriage 732 is fixed to a portion of the timing belt 743. When the timing belt 743 is run by the action of the carriage motor 741, the head unit 730 reciprocates while being guided by the carriage guide shaft 744. During this reciprocation, ink is appropriately ejected from the head to perform printing on the recording paper sheet P.

Note that the embodiment describes an example of the liquid ejecting apparatus in which printing is performed while both the liquid ejecting head 600 and the recording paper sheets P are moved. However, it will suffice that a liquid ejecting apparatus according to the invention has a mechanism in which printing is performed on the recording paper sheets P while the liquid ejecting head 600 and the recording paper sheets P are moved relative to each other. The embodiment describes an example in which printing is performed on the recording paper sheets P. However, recording media on which printing can be performed with a liquid ejecting apparatus according to the invention are not restricted to paper and may encompass various media such as cloth, film, metal, and the like. The configuration of the liquid ejecting apparatus can be modified in accordance with such media.

The control section 760 can control the head unit 730, the driving section 710, and the paper sheet supply section 750.

The paper sheet supply section 750 can transport the recording paper sheet P from the tray 721 to the head unit 730 side. The paper sheet supply section 750 includes a paper sheet supply motor 751 serving as a driving source of the paper sheet supply section 750 and paper sheet supply rollers 752 rotated by the action of the paper sheet supply motor 751. The paper sheet supply rollers 752 include a driven roller 752a and a driving roller 752b that vertically face each other with a transporting path of the recording paper sheets P therebetween. The driving roller 752b is connected to the paper sheet supply motor 751. When the paper sheet supply section 750 is driven by the control section 760, the recording paper sheet P is transported so as to be passed under the head unit 730.

The head unit 730, the driving section 710, the control section 760, and the paper sheet supply section 750 are disposed inside the apparatus body 720.

The liquid ejecting apparatus 700 includes the liquid ejecting head 600, which has a high withstand voltage. Accordingly, the liquid ejecting apparatus 700 has a high capability of ejecting liquid.

Note that the liquid ejecting apparatus 700 described above as an example includes a single liquid ejecting head 600 and is configured to perform printing on recording media with the liquid ejecting head 600. Alternatively, the liquid ejecting apparatus may include a plurality of liquid ejecting heads. When the liquid ejecting apparatus includes a plurality of liquid ejecting heads, the plurality of liquid ejecting heads may be independently operated in the above-described manner, or the plurality of liquid ejecting heads may be joined together and used as a single head assembly. An example of such a head assembly includes a linear head in which the nozzle openings of a plurality of heads are arranged at a uniform pitch.

As an example of a liquid ejecting apparatus according to the invention, the liquid ejecting apparatus 700 serving as an ink jet printer has been described. However, a liquid ejecting apparatus according to the invention can also be used as an industrial liquid ejecting apparatus. In this case, liquid (liquid material) ejected by such an apparatus may be, for example, a functional material that is adjusted to have an appropriate viscosity with a solvent or a dispersion medium. A liquid ejecting apparatus according to the invention can be suitably used as, in addition to an image recording apparatus such as a printer described above as an example, a colorant ejecting apparatus used for producing color filters of liquid crystal displays or the like; a liquid material ejecting apparatus used for forming electrodes or color filters of organic EL displays, field emission displays (FEDs), electrophoretic displays, or the like; or a bioorganic material ejecting apparatus used for producing biochips.

5. Examples and Comparative Examples

Hereinafter, the invention will be specifically described with reference to Examples and Comparative examples. However, the invention is not restricted by the following Examples.

5.1. Fabrication of Piezoelectric Elements

Piezoelectric elements in Examples 1 to 7 and Comparative examples 1 to 4 were fabricated in the following manner.

A substrate was produced by the following steps. A silicon dioxide film serving as an insulation film was formed on a single crystal silicon substrate by thermal oxidation. A titanium (Ti) film was formed on the silicon dioxide film by a RF magnetron sputtering method so as to have a thickness of 40 nm and was thermally oxidized to thereby form a titanium oxide film. A platinum (Pt) film was further formed on the titanium oxide film by a RF magnetron sputtering method so as to have a thickness of 100 nm. Thus, a lower electrode oriented in the (111) plane was formed. This lower electrode corresponds to the first conductive layer 10 in the above-described embodiment.

The piezoelectric layers 30 in Examples and Comparative examples were subsequently formed by a chemical solution method. Material solutions used in the chemical solution method were each prepared by mixing a metal alkoxide or an organic acid metal salt with a solvent (n-butanol). The material solutions were prepared so as to have metal compositions summarized in Tables 1 to 3 below. Tables 1 to 3 show the amounts of materials mixed, that is, mixing amounts (mol%). Each thin film was formed in the following manner. Such a material solution was spin-coated on the substrate on which the lower electrode had been formed, at 500 rpm for 10 seconds and then at 2,500 rpm for 30 seconds. The substrate was then placed on a hot plate at 150° C. and dried for 3 minutes. The substrate was then placed on a hot plate at 400° C. and calcined for 5 minutes. Such a step from the spin-coating to the calcination was repeated six times. Then, the substrate was annealed at 750° C. for 2 minutes in an oxygen atmosphere to provide the thin-film piezoelectric layer 30 by firing.

Lastly, a platinum (Pt) layer having a film thickness of 100 nm was formed by a DC sputtering method through a metal mask having openings having a diameter of 500 μm, on the substrate on which the lower electrode and the piezoelectric layer 30 had been formed. This platinum (Pt) layer is an upper electrode and corresponds to the second conductive layer 20 in the above-described embodiment.

In Comparative examples 1 and 2 and Examples 1 to 5, 0 mol % or more and 16 mol % or less of copper (Cu) was added with respect to 100 mol % of bismuth sodium titanate ($Bi_{0.5}$, $Na_{0.5}$)$TiO_3$.

In Comparative example 3 and Example 6, 0 mol % and 1 mol % of copper (Cu) were added with respect to 85 mol % of bismuth sodium titanate (($Bi_{0.5}$, $Na_{0.5}$)$TiO_3$) and 15 mol % of barium titanate ($BaTiO_3$).

In Comparative example 4 and Example 7, 0 mol % and 1 mol % of copper (Cu) were added with respect to 67 mol % of bismuth sodium titanate (($Bi_{0.5}$, $Na_{0.5}$)$TiO_3$), 30 mol % of bismuth potassium titanate (($Bi_{0.5}$, $K_{0.5}$)$TiO_3$), and 3 mol % of barium titanate ($BaTiO_3$).

5.2. Evaluation of Piezoelectric Elements

5.2.1. Evaluation of Leakage Current

The piezoelectric elements in Examples and Comparative examples were measured in terms of leakage current value with 4140B manufactured by Hewlett-Packard Company under evaluation conditions (delay time: 0.5 sec, hold time: 0.5 sec, applied electric field: 200 kV/cm, 300 kV/cm, 400 kV/cm, and 600 kV/cm). The piezoelectric elements were evaluated on the basis of the measured leakage current values. The measurement results are shown in Tables 1 to 3 below. Cases in Table 1 where a short circuit occurred and leakage current values were not measured are represented by "Short".

TABLE 1

| Unit | ($Bi_{0.5}$, $Na_{0.5}$)$TiO_3$ mol % | ($Bi_{0.5}$, $K_{0.5}$)$TiO_3$ mol % | $BaTiO_3$ mol % | Cu mol % | Leakage current value [$A/cm^2$] under applied electric field of 200 kV/cm | | Leakage current value [$A/cm^2$] under applied electric field of 400 kV/cm | |
|---|---|---|---|---|---|---|---|---|
| | | | | | Positive | Negative | Positive | Negative |
| Comparative example 1 | 100 | 0 | 0 | 0 | 0.042598726 | 0.003042038 | 0.312356688 | 0.082038217 |
| Example 1 | 100 | 0 | 0 | 0.2 | 0.000365860 | 0.000781769 | 0.211464968 | 0.021044586 |
| Example 2 | 100 | 0 | 0 | 0.5 | 0.000001676 | 0.000119745 | 0.004777196 | 0.003880835 |
| Example 3 | 100 | 0 | 0 | 1 | 0.000025427 | 0.000008764 | 0.000583949 | 0.000599745 |
| Example 4 | 100 | 0 | 0 | 4 | 0.000024090 | 0.000345478 | 0.000126815 | 0.001125544 |

TABLE 1-continued

| Unit | $(Bi_{0.5}, Na_{0.5})TiO_3$ mol % | $(Bi_{0.5}, K_{0.5})TiO_3$ mol % | $BaTiO_3$ mol % | Cu mol % | Leakage current value [A/cm²] under applied electric field of 200 kV/cm | | Leakage current value [A/cm²] under applied electric field of 400 kV/cm | |
|---|---|---|---|---|---|---|---|---|
| | | | | | Positive | Negative | Positive | Negative |
| Example 5 | 100 | 0 | 0 | 8 | 0.009115924 | 0.005383258 | 0.470318471 | Short |
| Comparative example 2 | 100 | 0 | 0 | 16 | Short | Short | Short | Short |

TABLE 2

| Unit | $(Bi_{0.5}, Na_{0.5})TiO_3$ mol % | $(Bi_{0.5}, K_{0.5})TiO_3$ mol % | $BaTiO_3$ mol % | Cu mol % | Leakage current value [A/cm²] under applied electric field of 300 kV/cm | | Leakage current value [A/cm²] under applied electric field of 600 kV/cm | |
|---|---|---|---|---|---|---|---|---|
| | | | | | Positive | Negative | Positive | Negative |
| Comparative example 3 | 85 | 0 | 15 | 0 | 0.000029488 | 0.000186912 | 0.002235809 | 0.003004846 |
| Example 6 | 85 | 0 | 15 | 1 | 0.000001304 | 0.000030965 | 0.000044360 | 0.000162975 |

TABLE 3

| Unit | $(Bi_{0.5}, Na_{0.5})TiO_3$ mol % | $(Bi_{0.5}, K_{0.5})TiO_3$ mol % | $BaTiO_3$ mol % | Cu mol % | Leakage current value [A/cm²] under applied electric field of 300 kV/cm | | Leakage current value [A/cm²] under applied electric field of 600 kV/cm | |
|---|---|---|---|---|---|---|---|---|
| | | | | | Positive | Negative | Positive | Negative |
| Comparative example 4 | 67 | 30 | 3 | 0 | 0.000008607 | 0.000112554 | 0.000244971 | 0.003677117 |
| Example 7 | 67 | 30 | 3 | 1 | 0.000000346 | 0.000000474 | 0.000001477 | 0.000002093 |

5.2.2. Evaluation of Hysteresis

Figure 5:
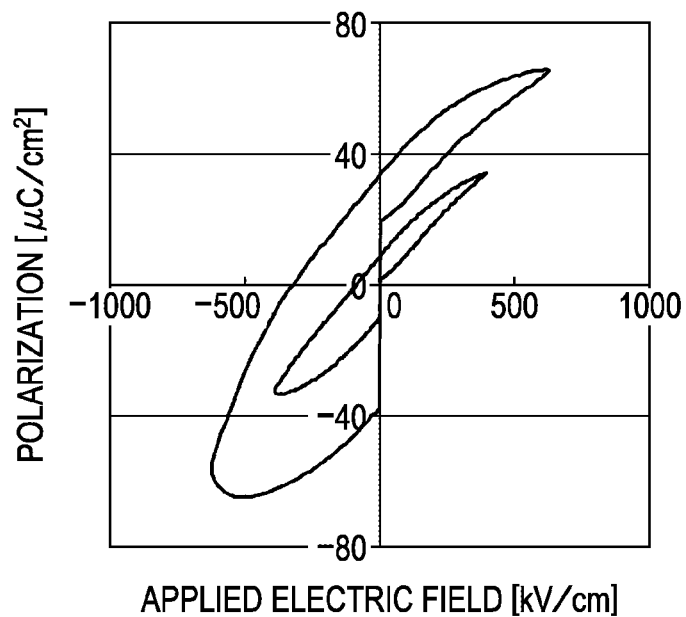
FIG. 5 is a hysteresis loop of a piezoelectric element in Comparative example 1.
Figure 6:
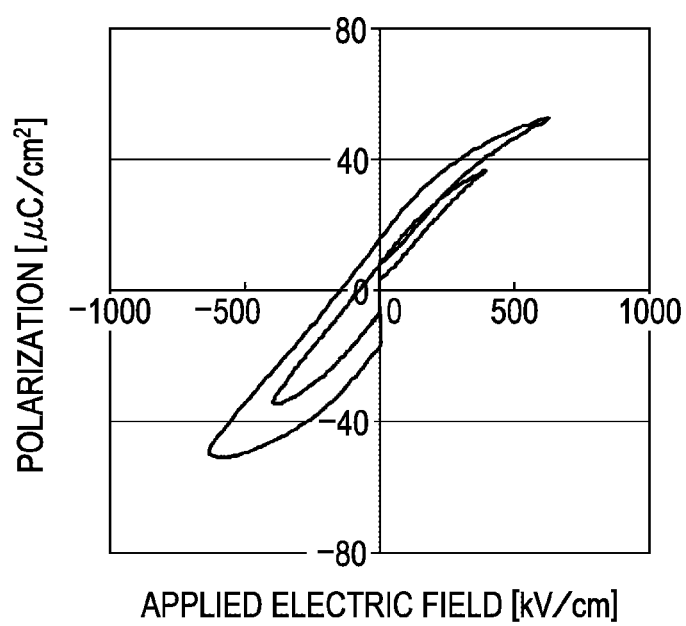
FIG. 6 is a hysteresis loop of a piezoelectric element in Example 1.
Figure 7:
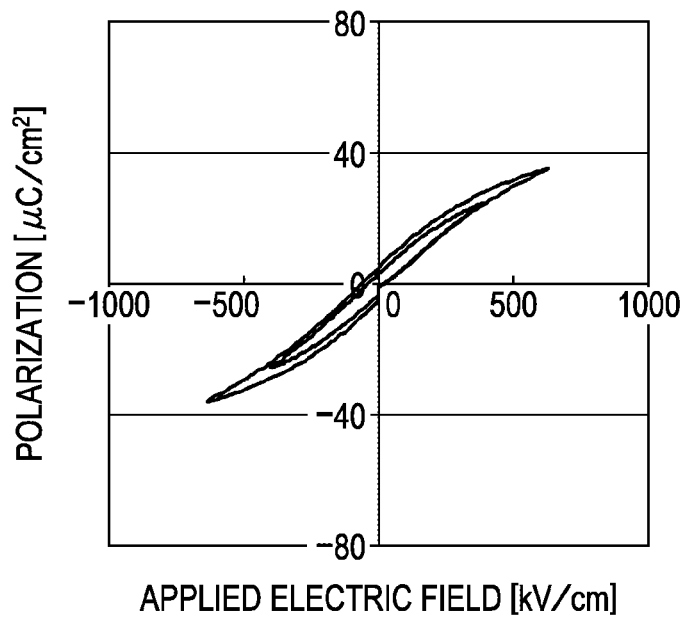
FIG. 7 is a hysteresis loop of a piezoelectric element in Example 3.
Figure 8:
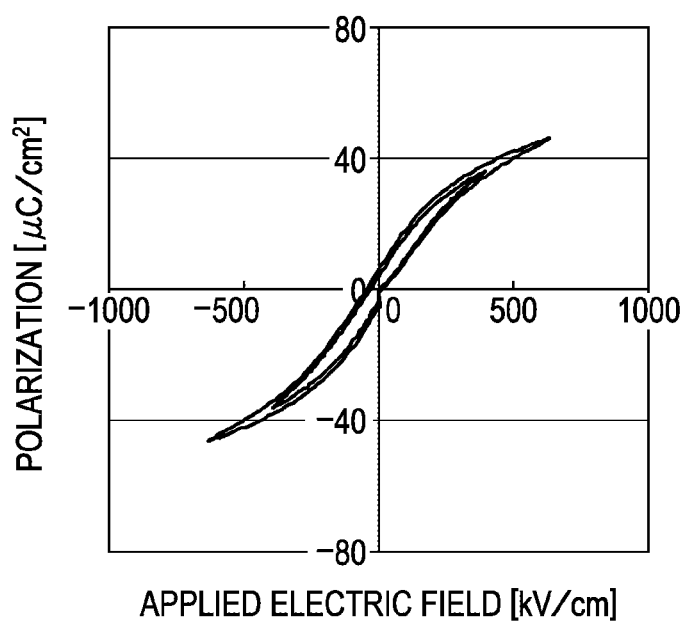
FIG. 8 is a hysteresis loop of a piezoelectric element in Example 5.
Figure 9:
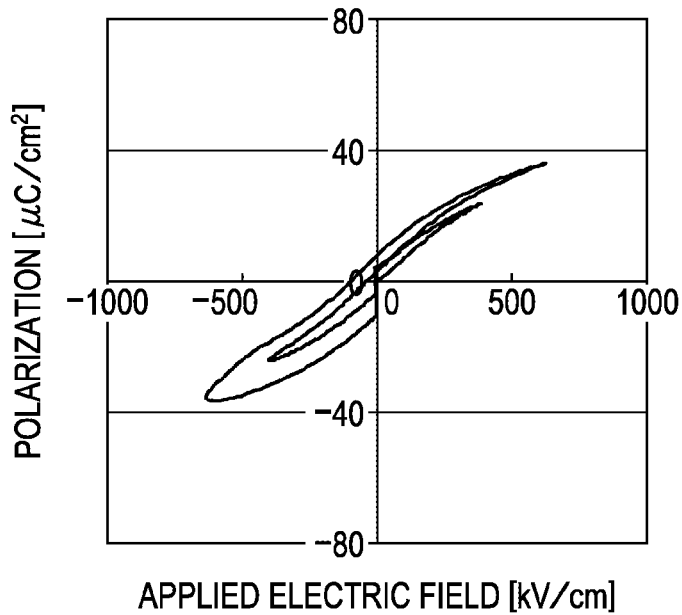
FIG. 9 is a hysteresis loop of a piezoelectric element in Comparative example 3.
Figure 10:
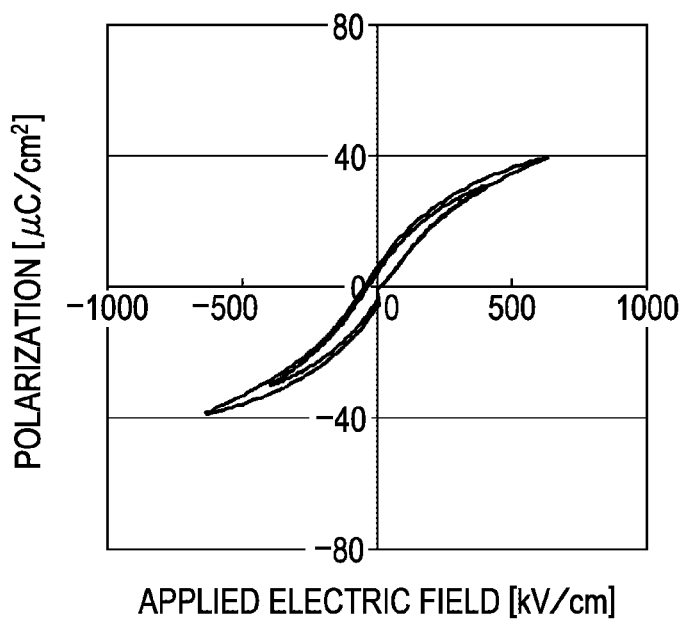
FIG. 10 is a hysteresis loop of a piezoelectric element in Example 6.
Figure 11:
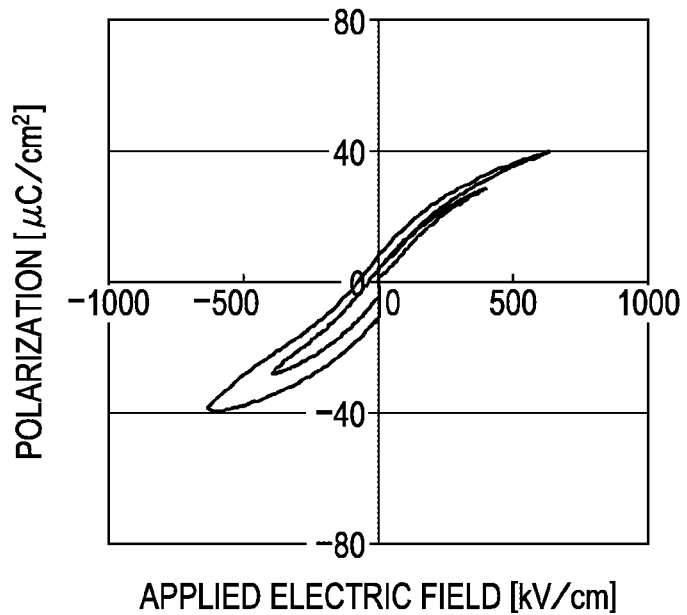
FIG. 11 is a hysteresis loop of a piezoelectric element in Comparative example 4.
Figure 12:
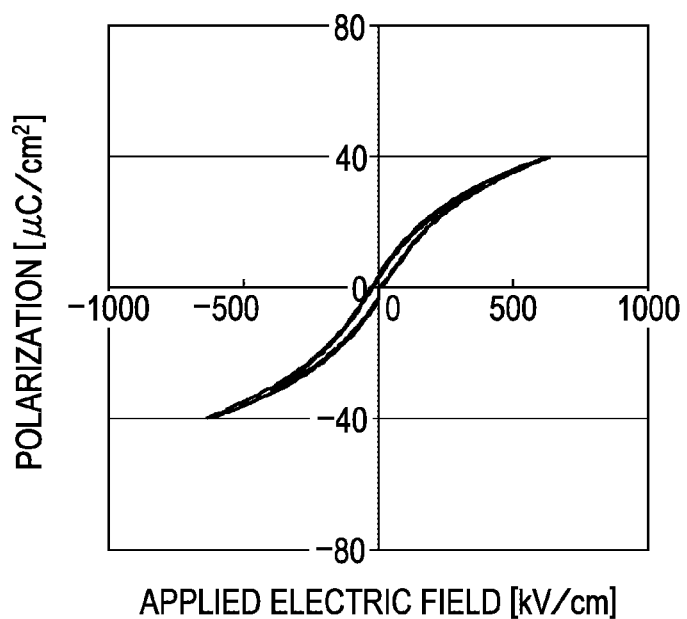
FIG. 12 is a hysteresis loop of a piezoelectric element in Example 7.

The piezoelectric elements in Examples and Comparative examples were measured in terms of hysteresis with FCE-1A manufactured by TOYO Corporation under measurement conditions (measurement temperature: room temperature, frequency: 1 kHz, waveform: triangular wave, applied electric field: 400 kV/cm and 630 kV/cm) to provide hysteresis loops. The piezoelectric elements were evaluated on the basis of the shape of the hysteresis loops. The samples of Examples and Comparative examples used in this evaluation were the same as those in the evaluation of leakage current. FIG. 5 is a hysteresis loop of the piezoelectric element in Comparative example 1. FIG. 6 is a hysteresis loop of the piezoelectric element in Example 1. FIG. 7 is a hysteresis loop of the piezoelectric element in Example 3. FIG. 8 is a hysteresis loop of the piezoelectric element in Example 5. FIG. 9 is a hysteresis loop of the piezoelectric element in Comparative example 3. FIG. 10 is a hysteresis loop of the piezoelectric element in Example 6. FIG. 11 is a hysteresis loop of the piezoelectric element in Comparative example 4. FIG. 12 is a hysteresis loop of the piezoelectric element in Example 7.

5.3. Evaluation Results

The leakage current values under the applied electric field of 200 kV/cm in Table 1 are compared with each other. Compared with Comparative example 1 in which copper was not added, Examples 1 to 5 in which 0.2 mol % or more and 8 mol % or less of copper were added have low leakage current values. In Comparative example 2, a short circuit occurred in both the positive side and the negative side. The leakage current values under the applied electric field of 400 kV/cm in Table 1 are compared with each other. Compared with Comparative example 1 in which copper was not added, Examples 1 to 4 in which 0.2 mol % or more and 4 mol % or less of copper were added have low leakage current values. A short circuit occurred in the negative side of Example 5 and Comparative example 2. Thus, it has been demonstrated that addition of a predetermined amount of copper results in a decrease in a leakage current value though the decrease varies in accordance with the applied electric field.

The leakage current values under the applied electric field of 300 kV/cm in Table 2 are compared with each other. Compared with Comparative example 3 in which copper was not added, Example 6 in which 1 mol % of copper was added has low leakage current values. The leakage current values under the applied electric field of 600 kV/cm in Table 2 are compared with each other. Compared with Comparative example 3 in which copper was not added, Example 6 in which 1 mol % of copper was added has low leakage current values. Thus, it has been demonstrated that addition of 1 mol % of copper results in a decrease in a leakage current value even in the case where a piezoelectric element contains 15 mol % of barium titanate as well as bismuth sodium titanate.

The leakage current values under the applied electric field of 300 kV/cm in Table 3 are compared with each other. Compared with Comparative example 4 in which copper was not added, Example 7 in which 1 mol % of copper was added has low leakage current values. The leakage current values under the applied electric field of 600 kV/cm in Table 3 are compared with each other. Compared with Comparative example 4 in which copper was not added, Example 7 in which 1 mol % of copper was added has low leakage current values. Thus, it has been demonstrated that addition of 1 mol % of copper results in a decrease in a leakage current value even in the case where a piezoelectric element contains bismuth potassium titanate as well as bismuth sodium titanate and barium titanate.

Referring to FIGS. 5 to 8, compared with the hysteresis loop of Comparative example 1 being roundish due to influence of leakage current, the hysteresis loops of Examples 1, 3, and 5 in which the predetermined amounts of copper were added have good sharp shapes and hence a good piezoelectricity is exhibited.

Referring to FIGS. 9 and 10, the hysteresis loop of Example 6 in which 1 mol % of copper was added has a better shape than that of Comparative example 3. Thus, it has been demonstrated that, even in the case where a piezoelectric layer contains 15 mol % of barium titanate, addition of 1 mol % of copper results in a good piezoelectricity.

Referring to FIGS. 11 and 12, the hysteresis loop of Example 7 in which 1 mol % of copper was added has a better shape than that of Comparative example 4. Thus, it has been demonstrated that, even in the case where a piezoelectric layer contains 3 mol % of barium titanate and 30 mol % of bismuth potassium titanate, addition of 1 mol % of copper results in a good piezoelectricity.

As has been described above, it has been demonstrated that piezoelectric elements according to the invention have a low environmental load and a good piezoelectricity.

Two or more embodiments freely selected from the above-described embodiments and modified embodiments can be appropriately combined. In such cases, the resultant embodiment can provide advantages of the original embodiments or can synergistically provide advantages of the original embodiments.

The invention is not restricted to the above-described embodiments and various modifications can be further made. For example, the invention encompasses substantially the same configurations (for example, a configuration having the same function, method, and result or a configuration having the same object and advantageous effect) as the configurations described in the embodiments. In addition, the invention encompasses configurations in which nonessential components are replaced in the configurations described in the embodiments. In addition, the invention encompasses configurations that provide the same function and advantageous effects or can achieve the same object as the configurations described in the embodiments. In addition, the invention encompasses configurations in which the configurations described in the embodiments are combined with existing techniques.

What is claimed is:
1. A piezoelectric element comprising:
a piezoelectric layer; and
an electrode which applies a voltage to the piezoelectric layer,
wherein the piezoelectric layer is composed of a solid solution containing bismuth sodium titanate and copper, and
wherein when a leakage current of the piezoelectric element is measured with a delay time of 0.5 sec, a hold time of 0.5 sec and an applied electric field of 200 kV/cm, the leakage current value is 0.000001676 to 0.009115924 A/cm2.
2. The piezoelectric element according to claim 1,
wherein the piezoelectric layer contains 0.2 mol % or more and 8.0 mol % or less of copper.
3. The piezoelectric element according to claim 1,
wherein the piezoelectric layer further contains barium titanate.
4. The piezoelectric element according to claim 3,
wherein the piezoelectric layer contains less than 100 mol % and 85 mol % or more of the bismuth sodium titanate; and
the piezoelectric layer contains more than 0 mol % and 15 mol % or less of the barium titanate.
5. The piezoelectric element according to claim 1,
wherein the piezoelectric layer further contains bismuth potassium titanate.
6. The piezoelectric element according to claim 5,
wherein the piezoelectric layer contains less than 100 mol % and 67 mol % or more of the bismuth sodium titanate;
the piezoelectric layer contains more than 0 mol % and 30 mol % or less of the bismuth potassium titanate; and
the piezoelectric layer contains more than 0 mol % and 3 mol % or less of the barium titanate.
7. The piezoelectric element according to claim 1,
wherein the piezoelectric layer is formed by a thin-film method.
8. A liquid ejecting apparatus comprising the piezoelectric element according to claim 1.
9. A liquid ejecting head comprising the piezoelectric element according to claim 1.
10. An ultrasonic device comprising the piezoelectric element according to claim 1.
11. A sensor comprising the piezoelectric element according to claim 1.
12. A timing device comprising the piezoelectric element according to claim 1.

* * * * *